(12) United States Patent
Hsu

(10) Patent No.: US 8,435,424 B2
(45) Date of Patent: May 7, 2013

(54) SOLVENT-FREE CONDUCTIVE PASTE COMPOSITION AND SOLAR CELL ELEMENT EMPLOYING THE SAME

(75) Inventor: Tsai-Fa Hsu, Kaohsiung (TW)

(73) Assignee: Eternal Chemical Co., Ltd., Kaohsiung (TW)

( * ) Notice: Subject to any disclaimer, the term of this patent is extended or adjusted under 35 U.S.C. 154(b) by 125 days.

(21) Appl. No.: 12/644,586

(22) Filed: Dec. 22, 2009

(65) Prior Publication Data

US 2010/0186823 A1 Jul. 29, 2010

(30) Foreign Application Priority Data

Dec. 31, 2008 (TW) ................................ 97151892 A

(51) Int. Cl.
*H01B 1/00* (2006.01)
(52) U.S. Cl.
USPC ........... 252/500; 252/502; 252/512; 252/513; 252/514; 252/519.21; 252/521.2; 106/31.92; 136/263; 427/375; 427/376.6; 430/284.1; 430/285.1
(58) Field of Classification Search .................. 252/500, 252/502, 521.2, 512–514, 519.21; 136/263; 106/31.92; 427/375, 376.6; 430/284.1, 285.1
See application file for complete search history.

(56) References Cited

U.S. PATENT DOCUMENTS

| | | | |
|---|---|---|---|
| 4,599,293 A | 7/1986 | Eckell et al. | |
| 5,356,949 A | 10/1994 | Komiyama et al. | |
| 6,951,666 B2 * | 10/2005 | Kodas et al. | 427/376.6 |
| 7,060,411 B2 | 6/2006 | Mitsui et al. | |
| 7,129,022 B2 * | 10/2006 | Kim et al. | 430/281.1 |
| 7,569,160 B2 * | 8/2009 | Oldenzijl et al. | 252/500 |
| 2003/0215747 A1 * | 11/2003 | Kim et al. | 430/284.1 |
| 2006/0060824 A1 | 3/2006 | Yasumura et al. | |
| 2007/0197362 A1 | 8/2007 | Sakata et al. | |
| 2007/0212627 A1 * | 9/2007 | Yanagawa et al. | 430/58.75 |
| 2008/0250972 A1 * | 10/2008 | Oldenzijl | 106/31.92 |
| 2009/0053483 A1 * | 2/2009 | Ito et al. | 428/195.1 |

FOREIGN PATENT DOCUMENTS

| | | | |
|---|---|---|---|
| JP | 63-265979 | * | 11/1988 |
| JP | 2008-108724 | * | 5/2008 |
| WO | WO 20070123270 A1 | * | 11/2007 |

OTHER PUBLICATIONS

English Translation of Search Report Issued Jul. 3, 2012 in a Counterpart Taiwan Application.

* cited by examiner

*Primary Examiner* — Khanh Tuan Nguyen
(74) *Attorney, Agent, or Firm* — Ladas & Parry LLP

(57) ABSTRACT

A solvent-free conductive paste composition including (a) a binder, (b) an initiator, (c) a glass powder and (d) a conductive powder; and a solar cell element having an electrode or wire made by coating and sintering the conductive paste composition coated on a silicon semiconductor substrate. The conductive paste composition is solvent-free so that it will not cause environmental problems with respect to the evaporation of solvents and will not be easy to spread out. The conductive paste composition facilitates the development of fine wire and high aspect ratio designs and can efficiently enhance the photoelectric conversion efficiency.

15 Claims, 2 Drawing Sheets

SOLVENT-FREE CONDUCTIVE PASTE COMPOSITION AND SOLAR CELL ELEMENT EMPLOYING THE SAME

BACKGROUND OF THE INVENTION

1. Field of the Invention

The present invention relates to a conductive paste composition and a solar cell element employing the same, in particular, to a conductive paste composition used for forming an electrode or wires on a silicon semiconductor substrate of a silicon wafer solar cell element, and a solar cell element made from the conductive paste composition.

2. Description of the Prior Art

Currently, as environmental problems such as energy shortage and green-house effect become increasingly severe, all countries are actively developing various possible alternative energy sources, and the greatest attention is paid to solar power generation. FIG. 1 is a schematic cross-sectional view of a solar cell element. Referring to FIG. 1, a surface of a p-type silicon semiconductor substrate 1 is fabricated into a pyramid-shaped rough surface so as to reduce the light reflection (the rough surface is not shown in FIG. 1 for simplicity of the drawing). Then, phosphorus or similar substance is thermally diffused to form an n-type impurity layer 2 having an opposite conductivity type on the side of a light-receiving surface of the p-type silicon semiconductor substrate 1, and form a p-n junction. Afterward, an anti-reflective layer 3 and an electrode 4 are formed on the n-type impurity layer 2. A silicon nitride film may be formed on the n-type impurity layer 2 by plasma chemical vapor deposition (CVD) as an anti-reflective layer 3. Then, a conductive silver paste containing a silver powder is coated on the anti-reflective layer 3 by screen printing, and then a drying and baking process and a sintering process are performed so as to form a front electrode 4. In the sintering process, the conductive paste used for forming the front electrode 4 may be sintered and penetrate into the n-type impurity layer 2. An aluminum back electrode layer 5 is formed on the backside of the p-type silicon semiconductor substrate 1 by printing, subsequently drying and baking, and then sintering at a high temperature a conductive aluminum paste containing an aluminum powder. In the sintering process, aluminum atoms diffuse into the p-type silicon semiconductor substrate 1, thereby forming an Al—Si alloy layer 6 between the aluminum back electrode layer 5 and the p-type silicon semiconductor substrate 1 and forming a p$^+$ layer 7 doped with a high concentration of aluminum. The p$^+$ layer 7 is generally referred to as a back surface field (BSF) layer and can prevent the recombination of electrons and holes and improve the energy conversion efficiency of solar cells. Moreover, in order to connect a plurality of solar cells in series to form a module, a conductive silver-aluminum paste may be printed on the aluminum back electrode layer 5 by screen printing, and then sintered to form a wire 8.

The back electrode may be formed by printing and drying the conductive silver-aluminum paste first, subsequently printing and drying the conductive aluminum paste, and then baking the two conductive pastes; and may also be formed by printing and drying the conductive aluminum paste first, subsequently printing the conductive silver-aluminum paste, and then drying and baking the two conductive pastes.

The conductive paste (silver paste, aluminum paste, and silver-aluminum paste) needed for the above process generally contain a conductive substance such as a silver powder or an aluminum powder, a glass powder, an organic vehicle, and other additives, where the organic vehicle includes a binder and a solvent. The organic vehicle functions to impart the conductive paste with a good compatibility and rheological property, for example, to impart the conductive paste with a suitable viscosity, good wettability and sintering property, and allow the powder in the conductive paste to be in a stable dispersion state. The binders commonly used in the art include polymethacrylates, ethyl cellulose, an alkyd resin, and the like. The solvents commonly used in the art include glycol ether-based organic solvents such as ethylene glycol monobutyl ether acetate and diethylene glycol monobutyl ether, or terpene-based solvents (for example, α-terpineol), and the like. The viscosity of the organic vehicle used in the art is adjusted with a solvent, so as to facilitate coating operations. However, as a large quantity of the solvent evaporates in the drying process after the printing, the environment will be contaminated, which is inconsistent with the concept of environmental protection. In addition, the drying process requires a long time, which becomes one of bottlenecks in increasing production capacity.

As conversion of sunlight into current is the most important characteristic of a solar cell, the photoelectric conversion efficiency is quite important. Among the conductive pastes, the silver paste in the front electrode has the greatest effect on the efficiency. Currently known methods for enhancing the photoelectric conversion efficiency include adjusting the composition of the glass powder or the silver powder in the silver paste, changing the particle size of the powder, and the like, as described in U.S. Pat. No. 4,235,644, U.S. Pat. No. 4,342,795, U.S. Pat. No. 5,661,041, and U.S. Pat. No. 7,176,152. The width and thickness of the printed wires or electrode, as well as wiring density and pattern, will affect the photoelectric conversion efficiency, depending on the selected conductive paste. The conductive paste will affect the width and thickness of the wires, and thus affect the light-receiving area and series impedance of silicon wafers. If the light-receiving area can be increased and the series impedance be reduced, the photoelectric conversion efficiency can be enhanced. However, as described above, currently known conductive pastes are solvent-based formulations containing a solvent, and when the silver electrode is fabricated on the light-receiving surface, as the wafer surface is roughened, the conductive silver paste will spread out during the printing due to the capillary action between the solvent and the roughened surface. Moreover, the flow of the paste due to gravity and the evaporation of the solvent during baking may cause the width of the wires to increase and the thickness of the wires to decrease, and meanwhile cause the light-shading area and the series impedance to increase. As a result, the photoelectric conversion efficiency is reduced.

SUMMARY OF THE INVENTION

Accordingly, the present invention is directed to a solvent-free conductive paste composition having a good coating property.

In order to achieve the above and other objectives, the present invention provides a solvent-free conductive paste composition, which comprises: (a) a binder, (b) an initiator, (c) a glass powder, and (d) a conductive powder.

The present invention also provides a solar cell, which includes an electrode or wires made from the conductive paste composition of the present invention.

DETAILED DESCRIPTION OF THE INVENTION

Figure 1:
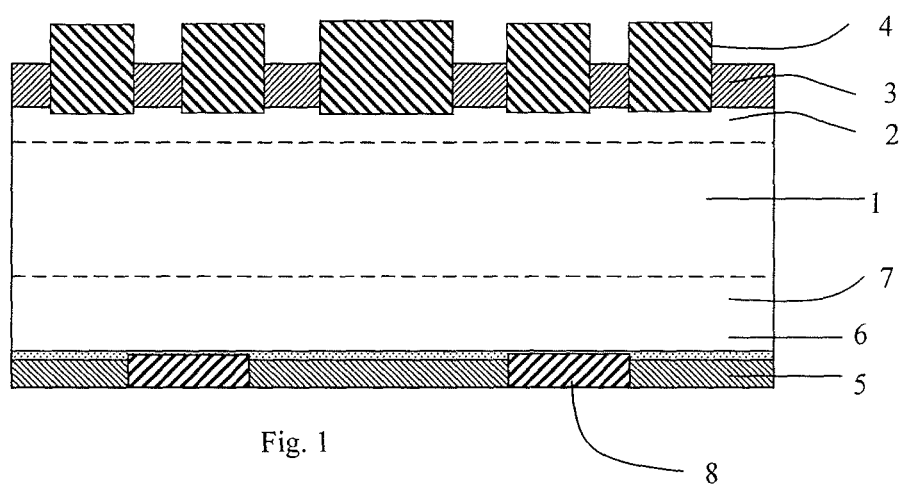
FIG. 1 is a schematic cross-sectional view of the structure of a solar cell element.

The binder used in the conductive paste composition of the present invention is preferably an acrylate resin, an epoxy resin, or a mixture thereof, and more preferably an acrylate resin.

The acrylate resin used in the present invention contains:
(i) a monomer; and
(ii) an acrylate oligomer.

The acrylate resin binder used in the present invention does not need to be used in combination with a solvent, and the conductive paste composition can be formulated so as to have a suitable viscosity and thixotropic index by using a low-molecular-weight monomer. The viscosity is preferably 30000-60000 cps, and the thixotropic index is preferably 3.5-5.5. When the amount of the monomer is 20-70 wt %, preferably 30-65 wt %, based on the total weight of the binder, the conductive paste composition can be applied easily. The conductive paste composition of the present invention is free of a solvent, so the change in the pattern due to the evaporation of solvents after the coating step can be avoided. Therefore, the conductive paste composition of the present invention can facilitate the development of fine wires and high aspect ratio designs and can effectively enhance the photoelectric conversion efficiency of the solar cell element.

The monomers suitable for the present invention have a molecular weight of less than 1000, preferably in a range from 180 to 700. The monomers suitable for the present invention include an acrylic monomer, an acrylate monomer or a mixture thereof, of which the acrylate monomers are preferred. The acrylate monomers include, for example, but are not limited to methyl methacrylate, butyl acrylate, 2-phenoxy ethyl acrylate, ethoxylated 2-phenoxy ethyl acrylate, 2-(2-ethoxyethoxy)ethyl acrylate, cyclic trimethylolpropane formal acrylate, β-carboxyethyl acrylate, lauryl (meth)acrylate, isooctyl acrylate, stearyl (meth)acrylate, isodecyl acrylate, isoborny (meth)acrylate, benzyl acrylate, hydroxypivalyl hydroxypivalate diacrylate, polyethylene glycol (200) diacrylate, ethoxylated 1,6-hexanediol diacrylate, dipropylene glycol diacrylate, ethoxylated dipropylene glycol diacrylate, neopentyl glycol diacrylate, propoxylated neopentyl glycol diacrylate, ethoxylated bisphenol-A di(meth)acrylate, 2-methyl-1,3-propanediol diacrylate, ethoxylated 2-methyl-1,3-propanediol diacrylate, 2-butyl-2-ethyl-1,3-propanediol diacrylate, ethylene glycol dimethacrylate, diethylene glycol dimethacrylate, 2-hydroxyethyl methacrylate phosphate, tris (2-hydroxy ethyl)isocyanurate triacrylate, pentaerythritol triacrylate, trimethylolpropane triacrylate, ethoxylated trimethylolpropane triacrylate, propoxylated trimethylolpropane triacrylate, trimethylolpropane trimethacrylate, pentaerythritol tetraacrylate, ethoxylated pentaerythritol tetraacrylate, ditrimethylolpropane tetraacrylate, propoxylated pentaerythritol tetraacrylate, pentaerythritol tetraacrylate, dipentaerythritol hexaacrylate, hydroxyethyl acrylate (HEA), hydroxyethyl methacrylate, (HEMA), tripropylene glycol di(meth) acrylate, 1,4-butanediol di(meth)acrylate, 1,6-hexanediol di(meth)acrylate, allylated cyclohexyl di(meth)acrylate, isocyanurate di(meth)acrylate, ethoxylated trimethylol propane tri(meth)acrylate, propoxylated glycerol tri(meth)acrylate, triethylene glycol dimethacrylate, trimethylol propane tri (meth)acrylate, tris(acryloxyethyl) isocyanurate and a mixture thereof. The preferred acrylate monomer is 2-phenoxy ethyl acrylate, 2-(2-ethoxyethoxy)ethyl acrylate, cyclic trimethylolpropane formal acrylate, polyethylene glycol diacrylate, ethylene glycol dimethacrylate, 2-hydroxyethyl methacrylate phosphate, dipentaerythritol hexaacrylate, stearyl acrylate, 1,4-butanediol diacrylate, triethylene glycol dimethacrylate, trimethylol propane tri(meth)acrylate or a mixture thereof. The examples of commercially available acrylate monomers include those with the trademarks EM2108®, EM210®, EM211®, EM212®, EM224®, EM231®, EM265®, EM320®, EM328®, and EM39®, produced by Eternal Company.

The acrylate oligomer in the binder of the present invention can be used as a crosslinking agent so as to increase the crosslinking degrees between the molecules, render the conductive paste composition easier to be cured. The acrylate oligomers suitable for the present invention may have one or more functional groups, of which those having more functional groups are preferred, and have a molecular weight in a range from about 1000 to about 100,000, preferably from about 5000 to about 100,000. The species of the acrylate oligomers include, for example, but are not limited to a urethane acrylate, such as aliphatic urethane acrylate, aliphatic urethane diacrylate, aliphatic urethane hexaacrylate, or aromatic urethane hexaacrylate; an epoxy acrylate, such as bisphenol-A epoxy diacrylate or novolac epoxy acrylate; a polyester acrylate, such as polyester diacrylate; a polyester polyol based acrylate; an acrylate homopolymer; or a mixture thereof. The commercially available acrylate oligomers suitable for the present invention include those under the trademark SR454®, SR494®, SR9020®, SR9021®, or SR9041® produced by Sartomer Company; those under the trademark 6101-100®, 6148-5®, 6148-J75®, 624-100®, 6184T-85® or 6161-100® produced by Eternal Company; and those under the trademark Ebecryl 600®, Ebecryl 830®, Ebecryl 3605®, or Ebecryl 6700® produced by UCB Company. According to the present invention, the amount of the acrylate oligomer, based on the total weight of the binder, is ranging from 20-60%, preferably from 25-55%.

In order to allow the conductive paste composition to exhibit excellent continuity when printing wires without occurring wire breakage, or to enhance the physical adsorption of the cured wires to the substrate so as to prevent the wires from peeling off, a pressure sensitive adhesive (PSA) with a high molecular weight, for example, an acrylate polymer, can be optionally added to the conductive paste composition of the present invention as one component of the binder. The acrylate polymers suitable for the present invention have a molecular weight of more than 100,000 and is pressure sensitive. The species of the acrylate polymers include, for example, but are not limited to a urethane acrylate, such as aliphatic urethane acrylate, aliphatic urethane diacrylate, aliphatic urethane hexaacrylate, or aromatic urethane hexaacrylate; an epoxy acrylate, such as bisphenol-A epoxy diacrylate or novolac epoxy acrylate; a polyester acrylate, such as polyester diacrylate, polyester hexaacrylate, or fatty acid modified hexa-functional polyester acrylate; a polyester polyol based acrylate; an acrylate homopolymer; or a mixture thereof. The commercially available acrylate polymer suitable for the present invention include those under the trademark 6311-100®, 6312-100®, 6311-100E® or 6323-100® produced by Eternal company. According to the present invention, the amount of the acrylate polymer (if present), based on the total weight of the binder, is ranging from 5-30%, preferably from 10-20%.

According to a preferred embodiment of the present invention, the binder of the present invention comprises an acrylate monomer, an acrylate oligomer and an acrylate polymer. The amount of the acrylate monomer, based on the total weight of the binder, is ranging from 20-70%, preferably from 30-65%; the amount of the acrylate oligomer, based on the total weight of the binder, is ranging from 20-60%, preferably from 25-55%; and the amount of the acrylate polymer, based on the total weight of the binder, is ranging from 5-30%, preferably from 10-20%.

The initiator suitable for the present invention is not particularly limited and can rapidly generate free radicals and induce polymerization through the transfer of the free radicals by providing heat or photoirradiation. Preferably, the half life of the initiator is about one hour (at a temperature above 100° C.). The amount of the initiator can be adjusted, depending on the species and amounts of the monomer/oligomer contained in the conductive paste composition. In general, the amount of the initiator, based on the total weight of the conductive paste composition, is ranging from about 0.05 wt % to 10 wt %, preferably from 0.1 wt % to 5 wt %.

The initiator suitable for the present invention can be a thermal initiator or a photoinitiator. The thermal initiators suitable for the present invention include, but are not limited to phenyl peroxide, dicumyl peroxide, butyl hydroperoxide (such as tert-butyl hydroperoxide), cumene hydroperoxide, tert-butyl maleic acid peroxide, acetyl peroxide, lauroyl peroxide, a mixture of one or more of the above peroxides with an amino acid or a sulfonic acid, a mixture of one or more of the above peroxides with a cobalt-containing compound, azo-diisobutyronitrile, or a mixture thereof, of which the preferred thermal initiator are butyl hydroperoxide, tert-butyl maleic acid peroxide, acetyl peroxide and lauroyl peroxide. The photoinitiators suitable for the present invention include, but are not limited to benzophenone, benzoin, 2-hydroxy-2-methyl-1-phenyl-propan-1-one, 2,2-dimethoxy-1,2-diphenylethan-1-one, 1-hydroxy cyclohexyl phenyl ketone, or 2,4,6-trimethylbenzoyl diphenyl phosphine oxide, or a mixture thereof. It is preferred to use a photoinitiator in the conductive paste composition of the present invention and the preferred photoinitiator is benzophenone or 1-hydroxy cyclohexyl phenyl ketone.

The glass powder used in the conductive paste composition of the present invention can improve the adhesion between the electrode/wires and the silicon wafer substrate after the sintering process, and can be any glass powder known to those of ordinary skill in the art, for example, any glass powder applicable to the conductive pastes for electric materials, and is preferably a lead-containing glass powder such as $PbO-SiO_2$ or $PbO-SiO_2-B_2O_3$. Moreover, $ZnO-SiO_2-B_2O_3$ and other lead-free glass powders may also be used. According to the present invention, the particle size of the glass powder is preferably in the range of 0.5-15 nm. Commercially available glass powders applicable to the present invention include those produced by NEG Company, under the trademark of GA-8® or GA-9®.

The conductive powder used in the conductive paste composition of the present invention may be any conductive powder known to those of ordinary skill in the art, and may be in any suitable form, for example, a conductive metal, an alloy of a conductive metal, or a mixture thereof. The species of the conductive metals include, for example, but are not limited to, Cu, Au, Ag, Al, Pd, or Pt, preferably Ag or Al, and more preferably Ag. Commercially available conductive silver powders applicable to the present invention include AA-0014®, AA-0981®, or EA-1001® of Metalor Company; and SF-7® or SF-65® of Ferro Company. The conductive powder can be selected according to the application of the conductive paste composition of the present invention. For example, a conductive silver powder can be used to formulate a conductive silver paste or a conductive silver-aluminum paste, or a conductive aluminum powder may be used to formulate a conductive aluminum paste. Moreover, in order to make the metal ions in the wires or electrode easily penetrate into the substrate, the conductive powder may optionally contain a trace amount of a conductive metal salt.

The conductive paste composition of the present invention may also optionally contain an additive known to those skilled in the art, including, but not limited to, a synergist, a sensitizer, a coupling agent, a dispersing agent, a wetting agent, a thickening agent, an antifoaming agent, and a thixotroping agent.

According to a preferred embodiment of the present invention, the conductive paste composition of the present invention comprises, based on the total weight of the conductive paste composition, 13-20 wt % of the binder, 73-80 wt % of the conductive powder, and 3-5 wt % of the glass powder, and the remaining percentage of the initiator and any optional additive component.

The conductive paste composition of the present invention can be applied to a solar cell element by any method well known to persons having ordinary skill in the art. For example, the conductive paste composition can form an electrode or wires in a solar cell element by a method including the following steps:

(a) Preparing a conductive paste composition by mixing the binder, the initiator, the glass powder, the conductive powder, and a suitable additive;

(b) Coating the conductive paste composition onto a substrate (for example, a single crystal silicon wafer) by a screen printer (with a screen of about 180-400 meshes), to form a film with a thickness of about 10-40 μm, and then a desired pattern by a printing process;

(c) Irradiating the pattern with an energy ray or heating the pattern, or both, so as to cure the pattern; and (d) Sintering the pattern using a sintering furnace so as to remove the binder and fuse the glass powder, conductive powder, and substrate together, thereby forming the wires or electrode.

In the above method, the curing of step (c) is preferably carried out through photo-polymerization caused by the irradiation of an energy ray. The energy ray refers to a light source having a certain wavelength range, for example, ultraviolet light, infrared light, visible light, or high-energy ray (electron beam), and is preferably ultraviolet light. The irradiation intensity can be 1-5000 $mJ/cm^2$, and is preferably 1000-2000 $mJ/cm^2$.

Steps (b) to (d) may be optionally repeated to form an electrode or wires on another surface of the substrate.

The conductive paste composition of the present invention is applicable to any conventional solar cell element to as a replacement of a conventional conductive paste composition, as the electrode or wires in the solar cell element. The conductive paste of the present invention is free of a solvent, so it will not cause environmental problems with respect to the evaporation of solvents and will not be easy to spread out to cause the light-shading area and the series impedance to increase. The conductive paste composition of the present invention facilitates the development of fine wires and high aspect ratio designs and can effectively enhance the photoelectric conversion efficiency. Moreover, as the conductive paste of the present invention is free of a solvent and can be cured and patterned quickly after being printed, it can also increase the production capacity.

The following examples take a conductive silver paste used for forming the front electrode as an example to further illustrate the features and application mode of the conductive paste composition of the present invention, but are not intended to limit the scope of the present invention. Any modification and variation that can be easily made by persons having ordinary skill in the art fall within the scope of the disclosure of the specification and the appended claims.

Comparative Example

Table 1 shows the composition of an ordinary solvent-containing conductive silver paste.

TABLE 1

| | |
|---|---|
| Ethyl cellulose | 4 wt % |
| Diethylene glycol monobutyl ether | 4 wt % |
| α-terpineol | 8 wt % |
| Silver powder | 79 wt % |
| Glass powder | 4 wt % |
| Dispersing agent | 1 wt % |

Ethyl cellulose was dissolved in the solvent (diethylene glycol monobutyl ether and α-terpineol). The dispersing agent (Rad2100® of TEGO Company) and the glass powder (GA-8® of NEG Company) were added in sequence. Afterward, the silver powder (AA-0014® of Metalor Company) was added. Then, the mixture was mixed with a low-speed mixer. After being homogeneously mixed, the mixture was dispersed using a ceramic three-roll mill to obtain a conductive silver paste.

The viscosity and thixotropic index of the resultant conductive silver paste were tested using a Brookfield HB viscometer with a CP51 platter, at 5 rpm and 25° C. The viscosity was determined to be 30654 cps, and the thixotropic index was 6.0.

Example

Table 2 shows the composition of a solvent-free conductive silver paste according to the present invention.

TABLE 2

| | | |
|---|---|---|
| Binder | Monomer 1 | 8 wt % |
| | Monomer 2 | 1.7 wt % |
| | Oligomer | 4 wt % |
| | Acrylate polymer | 2 wt % |
| Photo-initiator | | 0.3 wt % |
| Silver powder | | 79 wt % |
| Glass powder | | 4 wt % |
| Dispersing agent | | 1 wt % |

The components of the binder are as follows:

Monomer 1: 2-phenoxy ethyl acrylate (produced by Eternal, under the trademark of EM210®).

Monomer 2: triethylene glycol dimethacrylate (produced by Eternal, under the trademark of EM328®)

Oligomer: aliphatic urethane acrylate (produced by Eternal, under the trademark of 6101-100®)

Acrylate polymer: polyester hexaacrylate (produced by Eternal, under the trademark of 6323-100®).

The components were premixed according to the proportions shown in Table 2 to obtain the binder. Then, the dispersing agent (Rad2100® of TEGO) and the photo-initiator (produced by Ciba, under the trademark of IRGACURE 907) were added. After stirring, the glass powder (GA-8® of NEG) and the silver powder (AA-0014® of Metalor) were added. The mixture was dispersed to obtain a conductive silver paste. The preparation needed to be carried out under yellow light to avoid any influence on the photo-initiator. The viscosity and thixotropic index of the resultant conductive silver paste were tested using a Brookfield HB viscometer with a CP51 platter, at 5 rpm and 25° C. The viscosity was determined to be 54754 cps, and the thixotropic index was 4.6.

Testing Method 5-inch single crystal silicon wafers with roughened surfaces allowing for diffusion were provided. Ordinary commercially available conductive aluminum paste and conductive silver-aluminum paste were coated on a back surface of the wafer, and dried using an infrared hot-air drying oven. The two conductive silver pastes prepared in the Comparative Example and the Example were printed on the front surfaces of two wafers, respectively. Then, the conductive silver paste of the Comparative Example was cured using an infrared dryer, and the conductive silver paste of the Example was cured using an ultraviolet dryer, so as to form wires. Three wafers were prepared for each paste. In the above step, the screen of the screen printer used in the printing process is 400-mesh, with a wire opening of 70 μm. The temperature range for the curing step using the infrared dryer is 150-200° C., and the energy required by the ultraviolet curing step is 1500 mJ/cm$^2$.

Figure 2:
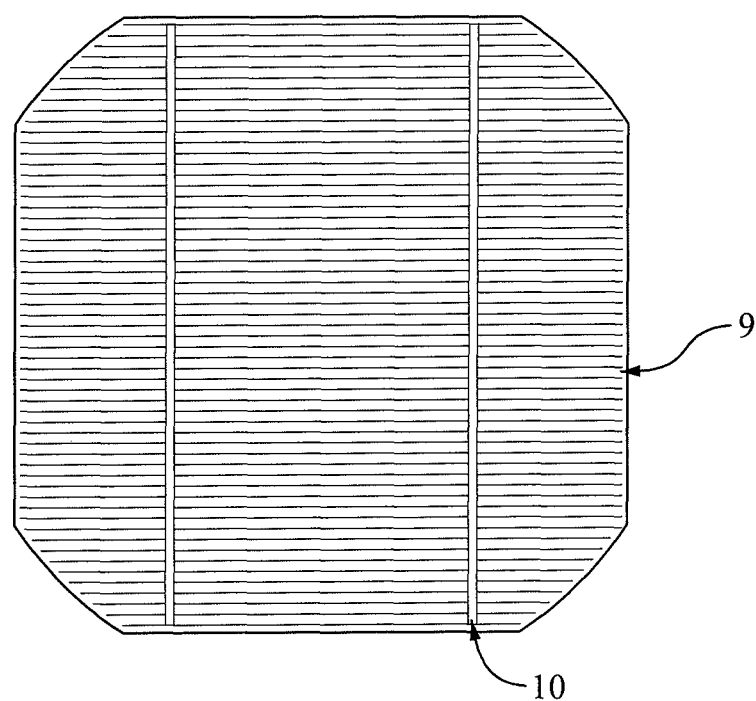
FIG. 2 is a photograph of a wafer having wires made from a conductive silver paste according to an embodiment of the present invention.

The dried wafers were sintered using the M-225 infrared sintering furnace produced by Thermal Process Solution. In the sintering process, the temperature was increased to a required temperature and maintained for a period of time, and finally lowered to room temperature. The highest temperature in the sintering process was about 750° C., and was at least maintained at above 600° C. for about 5 seconds. After the sintering process, the wafers were edge cut using a laser, and observed under a microscope or a photograph whether a broken line exists in the cut side of the wafers. FIG. 2 is a photograph of the wafer having a wire 9 (finger) and a wire 10 (busbar) made from the conductive silver paste of the Example. As shown in FIG. 2, the wire 9 has a good continuity, indicating that no wire breakage occurred in the printing or sintering process of the conductive paste composition of the present invention. The width and height of the wires made from the conductive silver pastes of the Comparative Example and the Example were measured by SEM. The short-circuit current (Isc), short-circuit current density (Jsc), open-circuit voltage (Voc), filling factor (F.F.), and the photoelectric conversion efficiency of the wafers of the Comparative Example and the Example were tested using a WACOM (WXS-220S-L2) photoelectric simulator (AM1.5G, 1000 W/m$^2$), and recorded in Table 3.

TABLE 3

| | Isc (A) | Jsc (mA/cm$^2$) | Voc (V) | F.F. (%) | Efficiency (%) | Wire Width (μm) | Wire Height (μm) |
|---|---|---|---|---|---|---|---|
| Comparative | 4.8923 | 33.9505 | 0.6023 | 73.83 | 15.098 | 83.4 | 14.5 |
| Example | 4.8768 | 33.8429 | 0.6017 | 72.01 | 14.662 | 85.2 | 14.8 |
| | 4.9178 | 34.1278 | 0.6036 | 72.13 | 14.858 | 85.1 | 15.2 |

TABLE 3-continued

|  | Isc (A) | Jsc (mA/cm$^2$) | Voc (V) | F.F. (%) | Efficiency (%) | Wire Width (μm) | Wire Height (μm) |
|---|---|---|---|---|---|---|---|
| Example | 4.8972 | 33.9849 | 0.6112 | 74.75 | 15.527 | 74.6 | 17.9 |
|  | 4.9126 | 34.0918 | 0.6107 | 74.20 | 15.448 | 74.7 | 16.9 |
|  | 4.9520 | 34.3648 | 0.6107 | 74.03 | 15.536 | 73.9 | 17.4 |

Through the comparison between the Example and the Comparative Example, it can be seen that the circuit of the present invention has a smaller width and a greater height, and thus has a higher aspect ratio. In addition, the conductive paste composition of the present invention has a higher viscosity, so that no obvious vertical flow will occur due to gravity after being printed until exposure. Moreover, the conductive paste of the present invention can be cured quickly and the wire width and height after printing can be maintained. By observing the cut side of the wafer under an electron microscope after printing, it is found that the circuit produced with the conductive paste of the present invention can have a smaller width and a greater height. Meanwhile, based on the improvement on the wire width and height, the filling factor (F.F.) can be significantly increased. Thus, the photoelectric conversion efficiency can be enhanced.

I claim:

1. A solvent-free conductive paste composition comprising: (a) a binder, (b) an initiator, (c) a glass powder and (d) a conductive powder, wherein the conductive paste composition comprises, based on the total weight of the conductive paste composition, 13-20% of the binder, 73-80% of the conductive powder, 3-5% of the glass powder, and 0.05-10% of the initiator; and exhibits a thixotropic index of 3.5-5.5, and wherein the conductive paste composition does not comprise a solvent, wherein the binder comprises:
(i) a monomer comprising an acrylic monomer, an acrylate monomer or a mixture thereof; and
(ii) an acrylate oligomer; and
wherein the acrylate oligomer has a molecular weight in a range from about 1,000 to about 100,000 and is selected from the group consisting of a urethane acrylate, an epoxy acrylate, a polyester acrylate, a polyester polyol based acrylate, an acrylate homopolymer and a mixture thereof.

2. The conductive paste composition of claim 1, wherein the binder further comprises (iii) an acrylate polymer.

3. The conductive paste composition of claim 2, wherein the acrylate polymer a molecular weight of more than 100,000 and is pressure sensitive and selected from the group consisting of a urethane acrylate, an epoxy acrylate, a polyester acrylate, a polyester polyol based acrylate, an acrylate homopolymer and a mixture thereof.

4. The conductive paste composition of claim 1, wherein the monomer is used in an amount of 20-70%, based on the total weight of the binder.

5. The conductive paste composition of claim 4, wherein the amount of the monomer is 30-65%.

6. The conductive paste composition of claim 1, wherein the monomer is an acrylate monomer having a molecular weight of less than 1,000 and is selected from the group consisting of 2-phenoxy ethyl acrylate, 2-(2-ethoxyethoxy) ethyl acrylate, lauryl acrylate, lauryl methacrylate, stearyl acrylate, isoborny acrylate, 1,4-butanediol diacrylate, triethylene glycol dimethacrylate, trimethylol propane triacrylate and a mixture thereof.

7. The conductive paste composition of claim 6, wherein the monomer has a molecular weight in a range from 180 to 700.

8. The conductive paste composition of claim 1, wherein the initiator is a thermal initiator or a photoinitiator.

9. The conductive paste composition of claim 8, wherein the thermal initiator is selected from the group consisting of phenyl peroxide, dicumyl peroxide, butyl hydroperoxide, cumene hydroperoxide, tert-butyl maleic acid peroxide, acetyl peroxide, lauroyl peroxide, a mixture of one or more of the above peroxides with an amino acid or a sulfonic acid, a mixture of one or more of the above peroxides with a cobalt-containing compound, azodiisobutyronitrile and a mixture thereof.

10. The conductive paste composition of claim 1, wherein the photoinitiator is selected from the group consisting of benzophenone, benzoin, 2-hydroxy-2-methyl-1-phenyl-propan-1-one, 2,2-dimethoxy-1,2-diphenylethan-1-one, 1-hydroxy cyclohexyl phenyl ketone, 2,4,6-trimethylbenzoyl diphenyl phosphine oxide and a mixture thereof.

11. The conductive paste composition of claim 1, wherein the conductive powder is a conductive metal, an alloy of a conductive metal, or a mixture thereof.

12. A solar cell element comprising an electrode or wires, wherein the electrode or wires comprises a cured conductive paste composition of claim 1.

13. A process for making an electrode or wires for use in a solar cell element, which comprises printing the conductive paste composition of claim 1 on a substrate to form a desired pattern, and curing the pattern by irradiation with energy rays and/or heat.

14. The conductive paste composition of claim 1, which further comprises an additive selected from the group consisting of a synergist, a sensitizer, a coupling agent, a thickening agent, an antifoaming agent, and a thixotroping agent.

15. The conductive paste composition of claim 1, wherein the composition has a viscosity of 30000-60000 cps.

* * * * *